US012763296B2

(12) United States Patent
Gondhalekar et al.

(10) Patent No.: US 12,763,296 B2
(45) Date of Patent: Oct. 13, 2026

(54) HEATED PEDESTAL WITH LOW IMPEDANCE RF ROD

(71) Applicant: Applied Materials, Inc., Santa Clara, CA (US)

(72) Inventors: Sudhir R. Gondhalekar, Fremont, CA (US); Peter Lai, Santa Clara, CA (US); Suresh Karavinakoppa, Bangalore (IN); Pavankumar Ramanand Harapanhalli, Bangalore (IN)

(73) Assignee: Applied Materials Inc., Santa Clara, CA (US)

( * ) Notice: Subject to any disclaimer, the term of this patent is extended or adjusted under 35 U.S.C. 154(b) by 484 days.

(21) Appl. No.: 18/234,731

(22) Filed: Aug. 16, 2023

(65) Prior Publication Data

US 2025/0062104 A1 Feb. 20, 2025

(51) Int. Cl.
*H01J 37/32* (2006.01)
*H03H 7/38* (2006.01)

(52) U.S. Cl.
CPC .. *H01J 37/32724* (2013.01); *H01J 37/32183* (2013.01); *H01J 37/32568* (2013.01); *H03H 7/38* (2013.01); *H01J 2237/2001* (2013.01)

(58) Field of Classification Search
None
See application file for complete search history.

(56) References Cited

U.S. PATENT DOCUMENTS 6,098,568 A 8/2000 Raoux et al.
6,136,388 A 10/2000 Raoux et al.
6,162,709 A 12/2000 Raoux et al.
7,004,107 B1 2/2006 Raoux et al.
9,593,410 B2 3/2017 Ge et al.
10,032,608 B2 7/2018 Chen et al.
10,049,862 B2 * 8/2018 Brown .............. H01J 37/32724
10,109,462 B2 10/2018 Hammond, IV et al.
10,125,422 B2 * 11/2018 Chen ................. H01J 37/32715
10,450,653 B2 10/2019 Chen et al.
10,879,041 B2 12/2020 Ye et al.
11,062,939 B2 7/2021 Gottheim et al.
(Continued)

FOREIGN PATENT DOCUMENTS

WO WO-2022076740 A1 * 4/2022 ....... H01L 21/68757

OTHER PUBLICATIONS

International Search Report for PCT/US2024/042290, dated Nov. 22, 2024.

*Primary Examiner* — Sylvia Macarthur
*Assistant Examiner* — Michelle Crowell
(74) *Attorney, Agent, or Firm* — Moser Taboada

(57) ABSTRACT

Embodiments of substrate supports for use in process chambers are provided herein. In some embodiments, a substrate support for a process chamber includes: a pedestal having a support surface for supporting a substrate, one or more heating elements disposed therein, and an RF electrode disposed therein; a hollow shaft coupled to a lower surface of the pedestal; and an RF rod extending through the hollow shaft and having an upper portion that includes an upper end coupled to the RF electrode, wherein the upper end of the RF rod has at least one of (a) a cross sectional width that is wider than a lower portion of the RF rod or (b) one or more slots.

18 Claims, 6 Drawing Sheets

(56) References Cited

U.S. PATENT DOCUMENTS

| | | | | |
|---|---|---|---|---|
| 2003/0037881 | A1* | 2/2003 | Barnes | H01J 37/3244 156/345.43 |
| 2005/0241769 | A1* | 11/2005 | Satoyoshi | H01J 37/32082 156/345.44 |
| 2014/0302256 | A1 | 10/2014 | Chen et al. | |
| 2015/0243483 | A1* | 8/2015 | Chen | H01J 37/32183 156/345.48 |
| 2016/0307743 | A1 | 10/2016 | Brown et al. | |
| 2017/0278682 | A1 | 9/2017 | Lin et al. | |
| 2017/0306494 | A1* | 10/2017 | Lin | H01J 37/32082 |
| 2018/0308669 | A1* | 10/2018 | Bokka | C23C 16/503 |
| 2018/0342375 | A1 | 11/2018 | Nguyen et al. | |
| 2019/0080916 | A1* | 3/2019 | Rocha-Alvarez | H01J 37/32091 |
| 2019/0177848 | A1* | 6/2019 | Chen | H01J 37/32715 |
| 2019/0341227 | A1* | 11/2019 | Thokachichu | H01J 37/32091 |
| 2019/0341232 | A1 | 11/2019 | Thokachichu | |
| 2020/0010957 | A1* | 1/2020 | Chen | C23C 16/46 |
| 2020/0161093 | A1 | 5/2020 | Li et al. | |
| 2020/0395199 | A1* | 12/2020 | Miyama | C23C 16/4405 |
| 2022/0108909 | A1 | 4/2022 | Tamura | |
| 2023/0058637 | A1* | 2/2023 | Unno | H01L 21/68785 |
| 2024/0186123 | A1* | 6/2024 | Yang | H01J 37/32724 |

* cited by examiner

HEATED PEDESTAL WITH LOW IMPEDANCE RF ROD

FIELD

Embodiments of the present disclosure generally relate to substrate processing equipment.

BACKGROUND

In the manufacture of integrated circuits and other electronic devices, plasma process chambers are often used for deposition or etching of various material layers. Plasma process chambers generally include heated pedestals for supporting a substrate during processing and controlling the temperature of the substrate during processing. During the life of a plasma process chamber, the heated pedestal may be refurbished to extend chamber life or replaced to accommodate different processes. However, a refurbished pedestal or a different pedestal may cause an impedance mismatch where an input impedance of an electrical load does not match an output impedance of the signal source, resulting in signal reflection or inefficient power transfer that causes process shift.

Accordingly, the inventors have provided herein embodiments of improved substrate supports for use in plasma process chambers.

SUMMARY

Embodiments of substrate supports for use in process chambers are provided herein. In some embodiments, a substrate support for a process chamber includes: a pedestal having a support surface for supporting a substrate, one or more heating elements disposed therein, and an RF electrode disposed therein; a hollow shaft coupled to a lower surface of the pedestal; and an RF rod extending through the hollow shaft and having an upper portion that includes an upper end coupled to the RF electrode, wherein the upper end of the RF rod has at least one of (a) a cross sectional width that is wider than a lower portion of the RF rod or (b) one or more slots.

In some embodiments, a substrate support for a process chamber includes: a pedestal having a support surface for supporting a substrate, one or more heating elements disposed therein, and an RF electrode disposed therein; a hollow shaft coupled to a lower surface of the pedestal; and an RF rod extending through the hollow shaft and having an upper end coupled to the RF electrode, wherein an RF transmission path of the RF rod comprising a total length of all edges disposed along the upper end is greater than a total length of a perimeter of the upper end of the RF rod; and wherein the upper end of the RF rod has at least one of (a) a cross sectional width that is wider than a lower portion of the RF rod or (b) one or more slots.

In some embodiments, a process chamber includes: a chamber body defining an interior volume therein; a substrate support disposed in the interior volume and including a pedestal having: a support surface for supporting a substrate, one or more heating elements disposed therein, and an RF electrode disposed therein; a hollow shaft coupled to a lower surface of the pedestal; and an RF rod extending through the hollow shaft and having an upper portion that includes an upper end coupled to the RF electrode, wherein the upper end of the RF rod has at least one of (a) a cross sectional width that is wider than a lower portion of the RF rod or (b) one or more slots.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
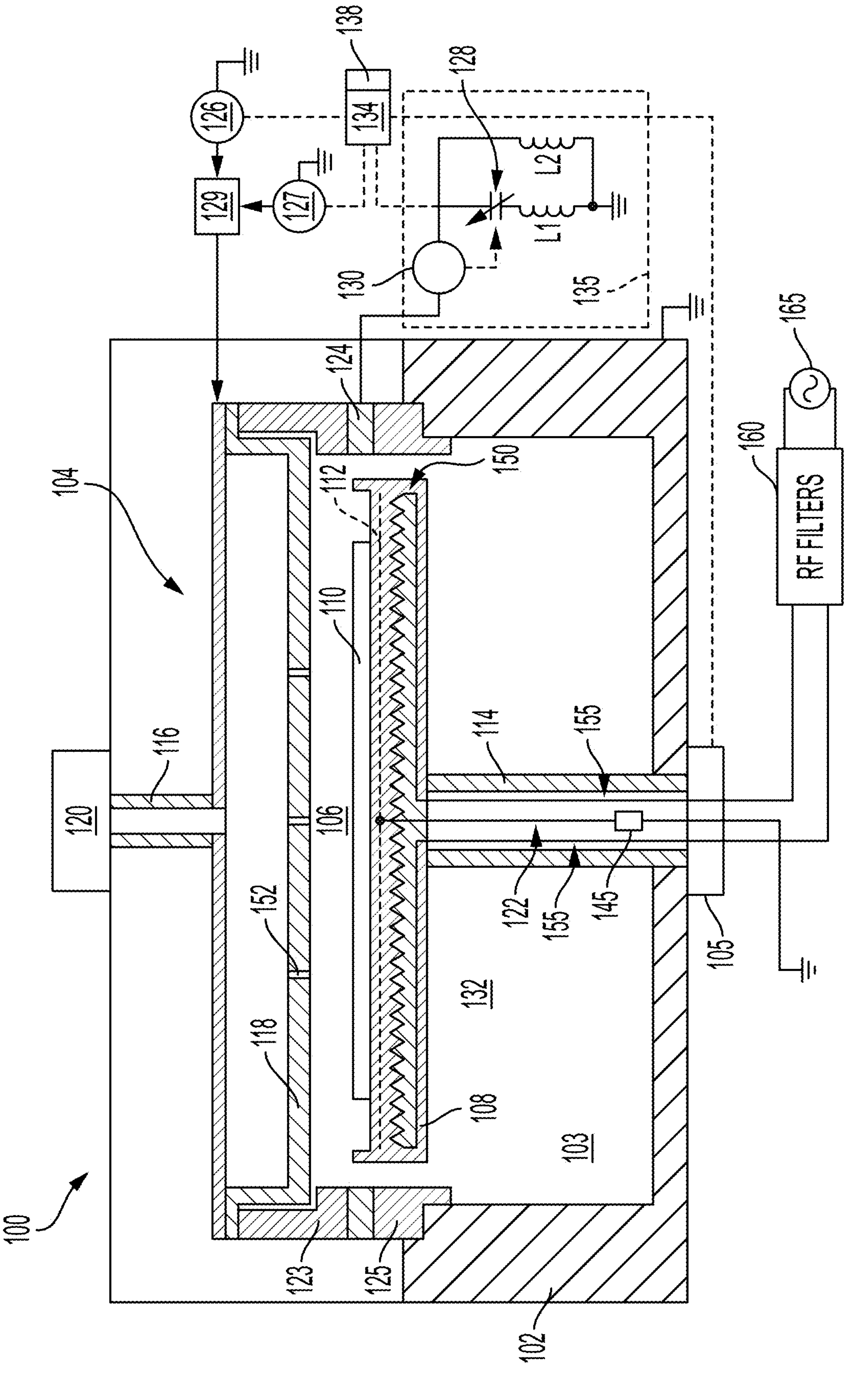
FIG. 1 depicts a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports having RF rods having reduced impedance are provided herein. The RF rods are configured to supply RF power from an RF power source to an RF electrode disposed in the substrate supports. Impedance mismatch occurs where an input impedance of an electrical load does not match an output impedance of the signal source such as the RF power source, which may lead to reduced power efficiency and reduced deposition rates. However, increasing impedance of an electrical load is easier to achieve than reducing impedance of the electrical loss. As such, the inventors have observed that reducing an impedance of the RF rods to a value at or below an output impedance is advantageous for impedance matching. The substrate supports described herein include an RF rod having an upper end with features such as one or more slots to advantageously increase an RF transmission path and to reduce an impedance of the RF rod.

RF energy is typically transmitted along edges of a surface. For example, for a conventional RF rod having an upper end that is planar, an RF transmission path extends along a circumference, or perimeter, of the RF rod. The upper end having a features (for example, one or more slots disposed along the upper end) advantageously increases an effective length of the RF transmission path to improve RF transmission and reduce impedance. In some embodiments, an adjustable impedance device is coupled to the RF rod and configured for adjusting the impedance of the substrate support to match the output impedance before installing the substrate support in the process chamber.

FIG. 1 is a schematic side cross-sectional depiction of a plasma processing chamber, according to at least some embodiments of the present disclosure. The plasma process chamber, or chamber 100, generally includes a chamber body 102 defining an interior volume 103 therein. A substrate support 108 is disposed in the interior volume 103 to support a substrate 110 disposed thereon. The chamber 100 is generally configured to deposit or etch one or more films onto or off of the substrate 110. The chamber 100 further includes a gas distribution assembly 104, which distributes gases uniformly into a process volume 106 of the interior volume 103 that is generally defined by a region between the gas distribution assembly 104 and the substrate support 108.

The substrate support 108 includes a pedestal 132 coupled to a hollow shaft 114. The pedestal 132 is movably disposed in the interior volume 103 via the hollow shaft 114 that extends through the chamber body 102 and connected to a drive system 105 and bellows to allow the pedestal 132 to be raised, lowered, and/or rotated. The gas distribution assembly 104 includes a gas inlet passage 116, which delivers gas from a gas flow controller 120 into a gas distribution manifold 118. The gas distribution manifold 118 includes a plurality of holes 152, or nozzles, through which gaseous mixtures are injected into the process volume 106 during processing.

A high frequency RF power source such as RF power source 126 and a low frequency RF power source such as RF power source 127 provide electromagnetic energy through a match circuit 129 to power the gas distribution manifold 118, which acts as an RF powered electrode, to facilitate generation of a plasma within the process volume 106 between the gas distribution manifold 118 and the pedestal 132. The pedestal 132 includes an RF electrode 112, which is electrically grounded through an RF rod 122, such that an electric field is generated in the chamber 100 between the gas distribution manifold 118 that is powered and the RF electrode 112. The RF rod 122 may be made of copper, nickel, or the like. In some embodiments, the RF electrode 112 comprises a conductive mesh, such as a tungsten or molybdenum containing mesh that is disposed within the dielectric material that is used to form the pedestal 132. The pedestal 132 may include a ceramic material, such as aluminum nitride (AlN), silicon nitride (SiN), silicon carbide (SiC), or the like.

A ceramic ring 123 is positioned below the gas distribution manifold 118. Optionally, a tuning ring 124 is disposed between the ceramic ring 123 and an isolator 125, which electrically isolates the tuning ring 124 from the chamber body 102. The tuning ring 124 is typically made from a conductive material, such as aluminum, titanium, or copper. As depicted in FIG. 1, the tuning ring 124 is positioned concentrically about the pedestal 132 and substrate 110 during processing of the substrate 110. The tuning ring 124 may be electrically coupled to an RF tuner 135, which includes a variable capacitor 128, such as a variable vacuum capacitor, that is terminated to ground through an inductor L1. The RF tuner 135 also includes a second inductor L2 that is electrically coupled in parallel to the variable capacitor 128 to provide a path for low frequency RF to ground. The RF tuner 135 also includes a sensor 130, such as a voltage/current (V/I) sensor, that is positioned between the tuning ring 124 and the variable capacitor 128 for use in controlling the current flow through the tuning ring 124 and the variable capacitor 128.

In some embodiments, the RF rod 122 is coupled to an impedance adjustment device 145 having at least one of a variable inductor or a variable resistor (discussed in more detail with respect to FIG. 3) configured to change the impedance of the substrate support 108. The impedance of the substrate support 108 may comprise the impedance of the RF rod 122, an impedance of the joint between the RF rod 122 and the RF electrode 112, and other resistance such as equivalent series resistance of components along the path between the RF source and the substrate support 108. The impedance adjustment device 145 may advantageously be used to tune the substrate support 108 to a target impedance value. In some embodiments, the target impedance of the substrate support 108 after adjustment via the impedance adjustment device 145 is less than about 0.4 ohms. In some embodiments, the target impedance of the substrate support 108 after adjustment via the impedance adjustment device 145 is between about 0.2 ohms and 0.4 ohms. Conventional RF rods may have an impedance of about 0.17 ohms or greater. The RF rod 122 has a low impedance to advantageously reduce RF power loss and/or to facilitate easier tuning of the impedance of the substrate support 108 to match the impedance of the RF source as compared to prior art apparatus. For example, in some embodiments, the impedance of the RF rod 122 is less than about 0.17 ohms. In some embodiments, the impedance of the RF rod 122 is less than about 0.06 ohms. In some embodiments, the impedance adjustment device 145 is configured to change the impedance of the substrate support 108 by about 0.05 to about 0.1 ohms.

One or more heating elements 150 are disposed within the pedestal 132 and are used to control a temperature profile across the substrate 110. In some embodiments, the one or more heating elements 150 are disposed beneath the RF electrode 112. The one or more heating elements 150 generally provide resistive heating to the substrate 110 and may be comprised of any feasible material, such as a conductive metal wire (e.g., refractory metal wire), patterned metal layer (e.g., molybdenum, tungsten, or other refractory metal layer), or other similar conductive structure. The heating elements 150 are connected to one or more conductive rods 155, which may extend along the length of the hollow shaft 114 of the pedestal 132. In some embodiments, the conductive rods 155 are positioned substantially parallel to the RF rod 122.

The conductive rods 155 couple the heating elements 150 to a heating power source 165, through one or more RF filters 160. The RF rod 122 and the conductive rods 155 are generally solid conductive elements (e.g., moderate diameter solid wire, non-stranded wire) that are formed from a conductive material, such as copper, nickel, gold, coated aluminum, a refractory metal, or the like. The RF filters 160 are generally either low-pass filters or band-stop filters that are configured to block RF energy from reaching the heating power source 165. In some embodiments, the heating power source 165 provides a non-RF, alternating current (AC) power to the heating elements 150. For example, the heating power source 165 may provide three-phase AC power at a frequency of approximately 60 Hertz.

In some embodiments, the RF filters 160 may be included in the heating assembly to provide a relatively greater impedance path to ground to minimize the amount of RF leakage to the heating elements 150. The RF filters 160 may be inserted in between heating elements 150 and the corresponding AC source(s) to attenuate RF energy and to suppress RF leakage current. In some configurations, the impedance of the RF electrode 112 to ground is substantially less than the impedance of the heating elements 150 to ground.

A system controller 134 controls the functions of the various components, such as the RF power sources 126 and 127, the drive system 105, the variable capacitor 128, and the heating power source 165. The system controller 134 executes system control software stored in a memory 138. The system controller 134 comprises parts of or all of one or more integrated circuits (ICs) and/or other circuitry components. The system controller 134 may in some cases include a central processing unit (CPU) (not shown), memory (not shown), and support circuits (or I/O) (not shown). The CPU may be one of any form of computer processor that is used for controlling various system functions and support hardware and monitoring the processes being controlled by and within the chamber 100. The memory is coupled to the CPU, and may be one or more of a readily available memory, such as random access memory (RAM), read only memory (ROM), floppy disk, hard disk, or any other form of digital storage, local or remote. Software instructions (or computer instructions) and data may be coded and stored within the memory for instructing the CPU. The software instructions may include a program that determines which tasks are to be performed at any instant in time. The support circuits are also connected to the CPU for supporting the processor in a conventional manner. The support circuits may include cache, power supplies, clock circuits, timing circuits, input/output circuitry, subsystems, and the like.

In use, an RF path is established between the powered gas distribution manifold 118 and the RF electrode 112 via plasma. Further, by changing the capacitance of the variable capacitor 128, the impedance for the RF path through the RF electrode 112 changes, in turn, causing a change in the RF field coupled to the RF electrode 112 and a change in the RF return current through the RF electrode 112 and the RF rod 122. Therefore, the plasma in the process volume 106 may be modulated across the surface of the substrate 110 during plasma processing for improved processing uniformity.

Further, in some embodiments, an additional RF path is established between the powered gas distribution manifold 118 and the tuning ring 124. Additionally, by changing the capacitance of the variable capacitor 128, the impedance for the RF path through the tuning ring 124 changes, in turn, causing a change in the RF field coupled to the tuning ring 124. For example, a maximum current and corresponding minimum impedance of the tuning ring 124 can be achieved by varying the total capacitance of the variable capacitor 128. Therefore, the plasma in the process volume 106 may also be modulated across the surface of the substrate 110 using the additional RF path.

Figure 2:
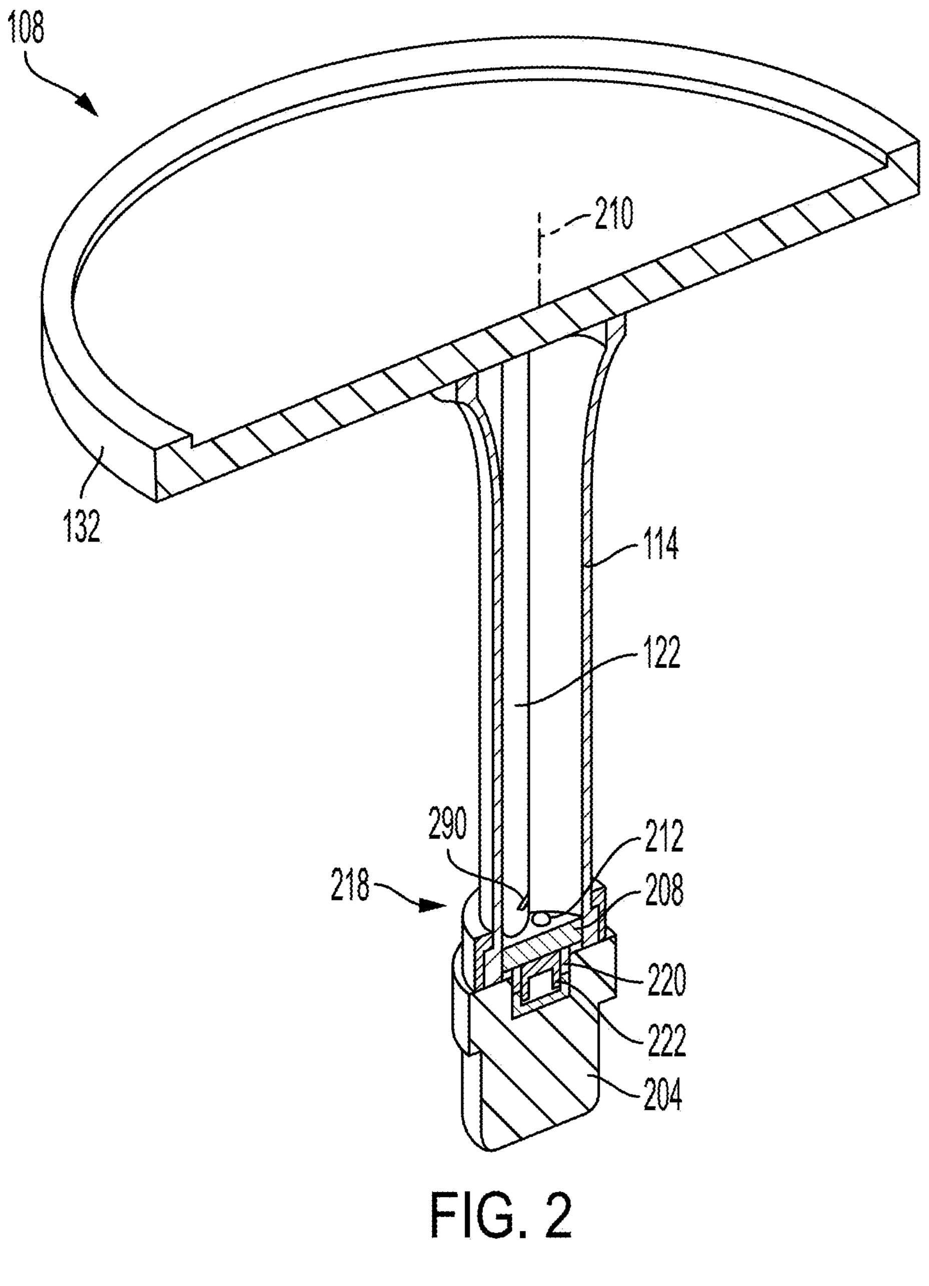
FIG. 2 depicts an isometric view of a substrate support in accordance with at least some embodiments of the present disclosure.

FIG. 2 depicts an isometric view of a substrate support 108 in accordance with at least some embodiments of the present disclosure. The RF rod 122 extends through the hollow shaft 114 of the substrate support 108 and is coupled to the pedestal 132 of the substrate support 108. In some embodiments, the RF rod 122 is disposed radially outward of a center 210 of the pedestal 132. In some embodiments, the RF rod 122 includes one or more slits 290 in the form of gaps to facilitate reducing stress on the RF rod 122 during thermal cycling. In some embodiments, the one or more slits 290 are disposed near a lower end of the RF rod 122. In some embodiments, a spacer plate 208 is disposed in the hollow shaft 114 to position the RF rod 122 therein. The spacer plate 208 may include one or more openings 212 to accommodate the RF rod 122 and the conductive rods 155 and maintain a spacing therebetween. In some embodiments, the spacer plate 208 is disposed in the hollow shaft 114 at a lower end 218 of the RF rod 122. The spacer plate 208 is generally made of an insulative material.

The hollow shaft 114 may be coupled to a lower block 204 made of a metal material, for example stainless steel. In some embodiments, a feedthrough 222 is disposed in the lower block 204 to provide an electrical feedthrough for the one or more conductive rods 155. In some embodiments, the feedthrough 222 is configured to facilitate a path to ground for the RF rod 122. In some embodiments, the lower end 218 of the RF rod 122 is coupled to a ceramic insulator 220 disposed in the lower block 204. The ceramic insulator 220 may separate the spacer plate 208 from the feedthrough 222 and the lower block 204 and be configured for higher temperature applications.

Figure 3:
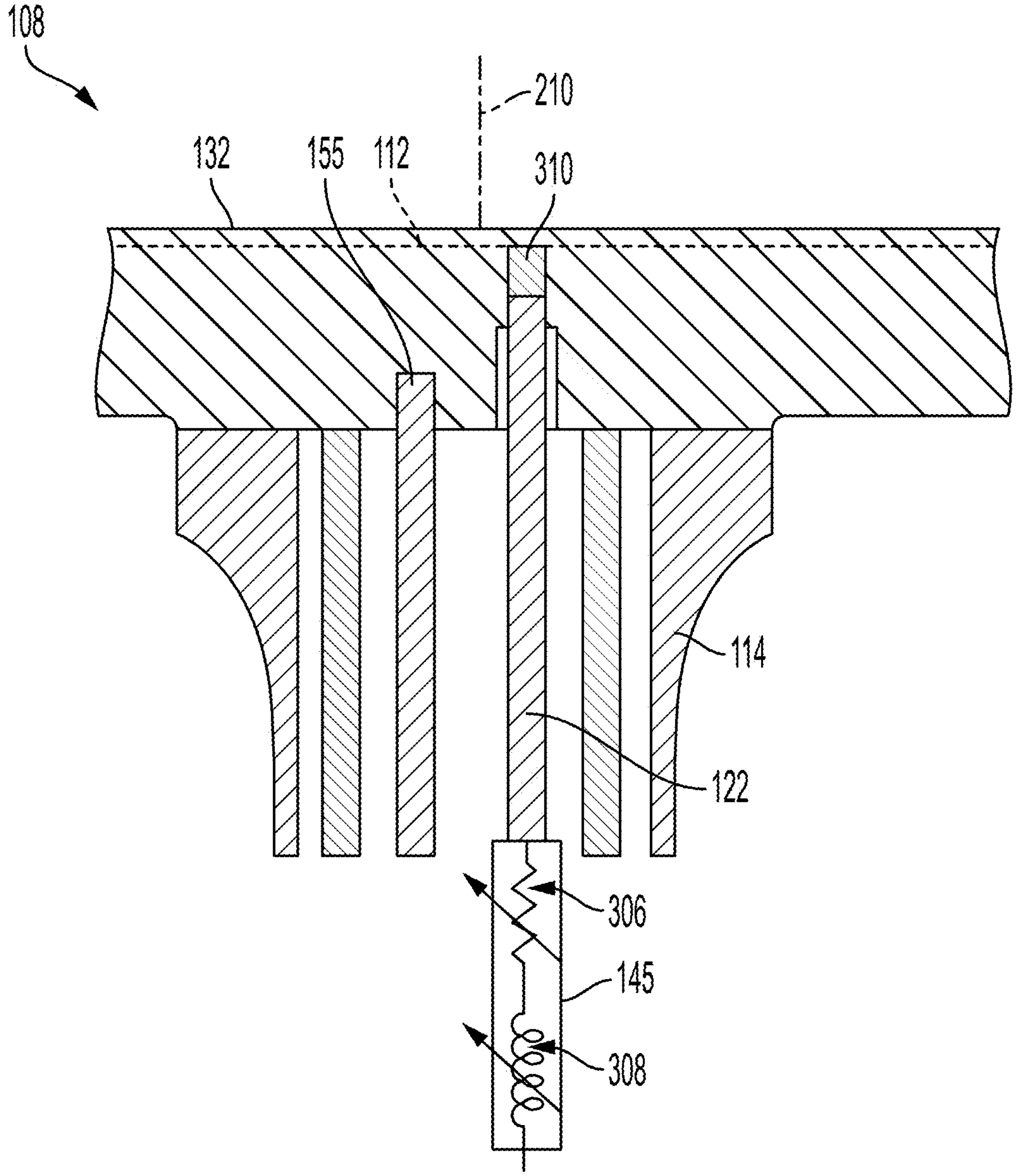
FIG. 3 depicts a schematic cross-sectional side view of a portion of a substrate support in accordance with at least some embodiments of the present disclosure.

FIG. 3 depicts a schematic cross-sectional side view of a portion of a substrate support 108 in accordance with at least some embodiments of the present disclosure. The inventors have observed that an impedance of the substrate support 108 may be reduced by plating the RF rod 122 or brazing the RF rod 122 to the RF electrode 112. For example, the RF rod 122 may be plated with nickel, gold, or silver. In some embodiments, the plating has a thickness of about 30 to about 50 micrometers. In some embodiments, the RF rod 122 is brazed to the RF electrode 112 via a metal 310. In some embodiments, the metal 310 is made of copper, gold, silver, or nickel.

In some embodiments, the RF electrode 112 formed in the pedestal 132 is electrically coupled through RF rod 122 to an impedance adjustment device 145. The impedance adjustment device 145 is disposed in the hollow shaft 114. In some embodiments, the impedance adjustment device 145 is disposed in the interior volume 103. In some embodiments, the impedance adjustment device 145 includes at least one of a variable inductor 308 or a variable resistor 306. The impedance adjustment device 145 may be configured to tune the substrate support 108 to a desired impedance value prior to installation in the chamber 100. The impedance adjustment device 145 generally does not adjust the impedance of the substrate support 108 during processing of the substrate 110. In other words, the impedance adjustment device 145 does not provide in-situ adjustment.

Figure 4A:
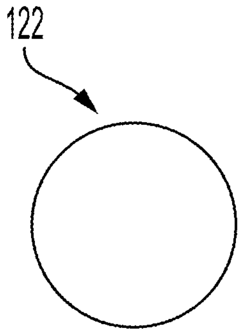
FIGS. 4A-4G depict various cross-sectional shapes of an RF rod in accordance with at least some embodiments of the present disclosure.
Figure 4B:
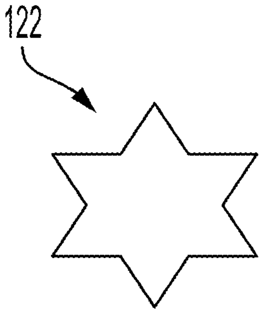
Figure 4C:
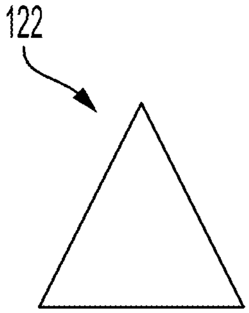
Figure 4D:
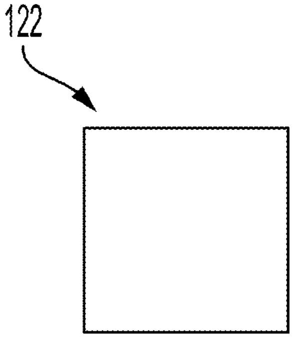
Figure 4E:
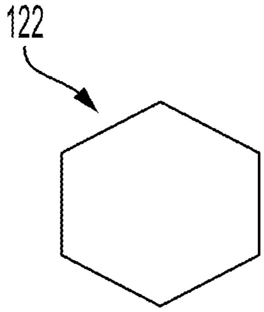
Figure 4F:
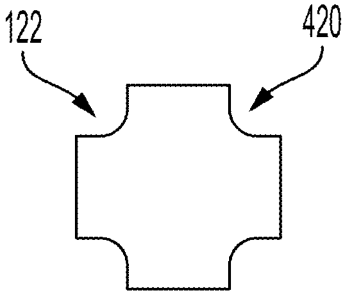
Figure 4G:
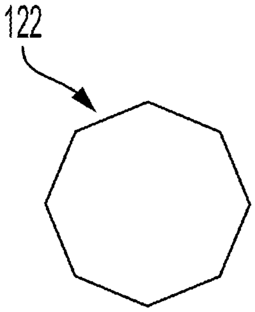

FIGS. 4A-4G depict various cross-sectional shapes of an RF rod 122 in accordance with at least some embodiments of the present disclosure. The inventors have observed that an impedance of the substrate support 108 may be reduced by increasing a cross-sectional area of the RF rod 122. In some embodiments, as depicted in FIG. 4A, the RF rod 122 has a circular cross-sectional shape. In some embodiments, the RF rod 122 has a non-circular cross-sectional shape. For example, FIG. 4B depicts the RF rod 122 having a star-like cross-sectional shape. FIG. 4C depicts the RF rod 122 having a triangular cross-section. FIG. 4D depicts the RF rod 122 having a square cross-sectional shape. In some embodiments, the RF rod 122 has a polygonal cross-sectional shape. For example, the RF rod 122 as shown in FIGS. 4C and 4D. In other examples, as depicted in FIG. 4E, the RF rod 122 may have a hexagonal cross-sectional shape, or as depicted in FIG. 4G, an octagonal cross-sectional shape. In some embodiments, as depicted in FIG. 4F, the RF rod 122 may have a square shape with indented features 420 at the 4 corners of the RF rod 122. In some embodiments, the RF rod 122 has a circular shape with a diameter of the RF rod 122 being about 0.10 inches to about 0.14 inches. In some embodiments, the diameter of the RF rod 122 is about 0.11 to about 0.13 inches.

Figure 5:
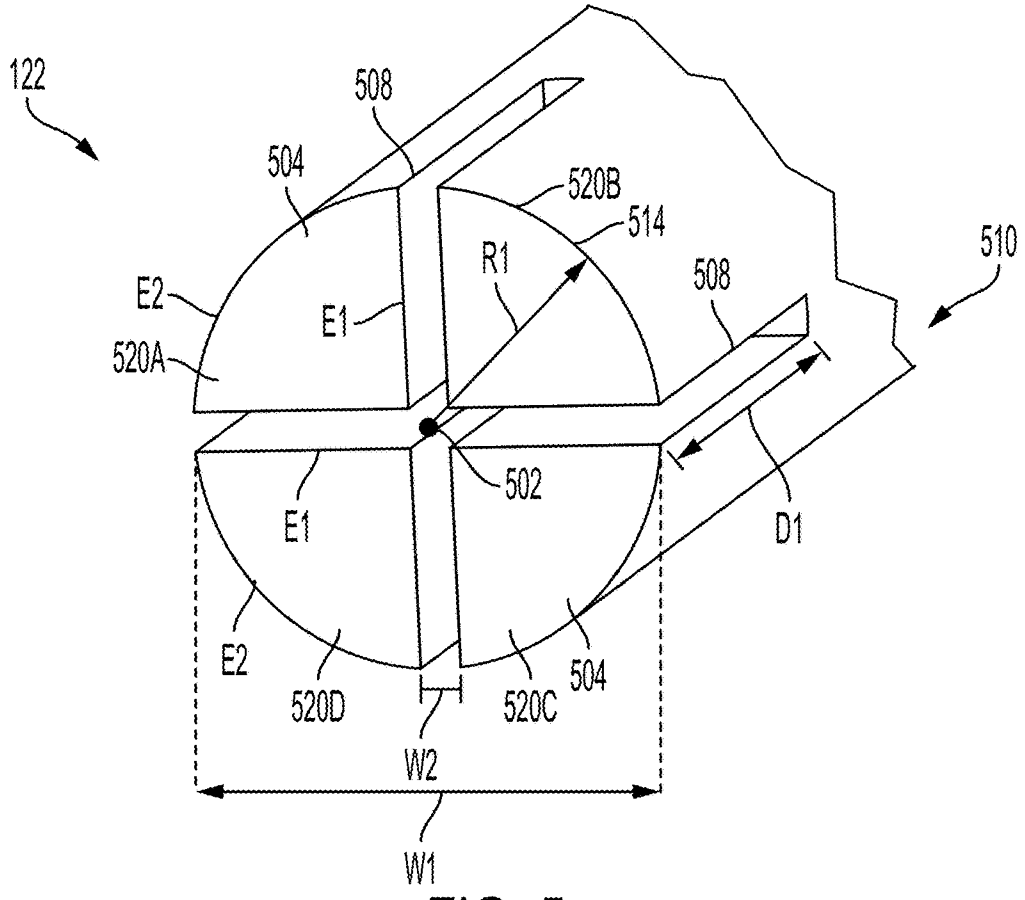
FIG. 5 depicts an isometric view of an upper portion of an RF rod in accordance with at least some embodiments of the present disclosure.

FIG. 5 depicts an isometric view of an upper portion 510 of an RF rod in accordance with at least some embodiments of the present disclosure. The RF rod 122 is coupled to the RF electrode 112 via an upper end 504 of the RF rod 122. The upper end is a non-continuous surface comprising features such as one or more slots 508 configured to increase an RF transmission path of the RF rod 122. For example, an RF transmission path of the RF rod 122 may comprise a total linear length of all edges disposed along the upper end 504. The RF transmission path of the RF rod 122 having features such as the one or more slots 508 is generally greater than a total length of a perimeter of the upper end 504 of the RF rod 122 to advantageously reduce impedance of the RF rod 122.

For example, for the RF rod 122 depicted in FIG. 5, the RF rod 122 has a radius R1 and thus a perimeter, or circumference, of 2 times R1 times pi. The one or more slots 508 disposed along the upper end 504 separate the upper end 504 into four portions 520A-520D. Each of the four portions 520A-520D define a linear edge along the upper end 504 defined by two radial edges, with each having a length E1 connected to a curved outer edge having a length E2. A linear length of all edges disposed along the upper end 504 for each of the four portions 520A-520D is therefore, length E1 plus length E1 plus length E2, or L1. Thus, the RF transmission path of the RF rod 122 depicted in FIG. 5 is four times L1.

In some embodiments, the one or more slots 508 have a depth D1 greater than a width W1, or diameter in the case of a round shaped RF rod, of the upper end 504. In some embodiments, the one or more slots 508 have a width W2 of about 0.01 inches or more to reduce or prevent arcing. In some embodiments, the depth D1 is greater than about 0.01 inches. In some embodiments, the depth D1 is about 0.01 to about 0.02 inches. The one or more slots 508 are also configured such that the upper end 504 has sufficient surface area to provide a good bond with the RF electrode 112, for example, a good brazed joint via the metal 310. In some embodiments, the one or more slots 508 comprise a plurality of slots extending from a center 502 of the upper end 504 to an outer edge 514 of the upper end 504. In some embodiments, as depicted in FIG. 5, the one or more slots 508 consist of two slots that intersect at the center 502 of the upper end 504.

Figure 6:
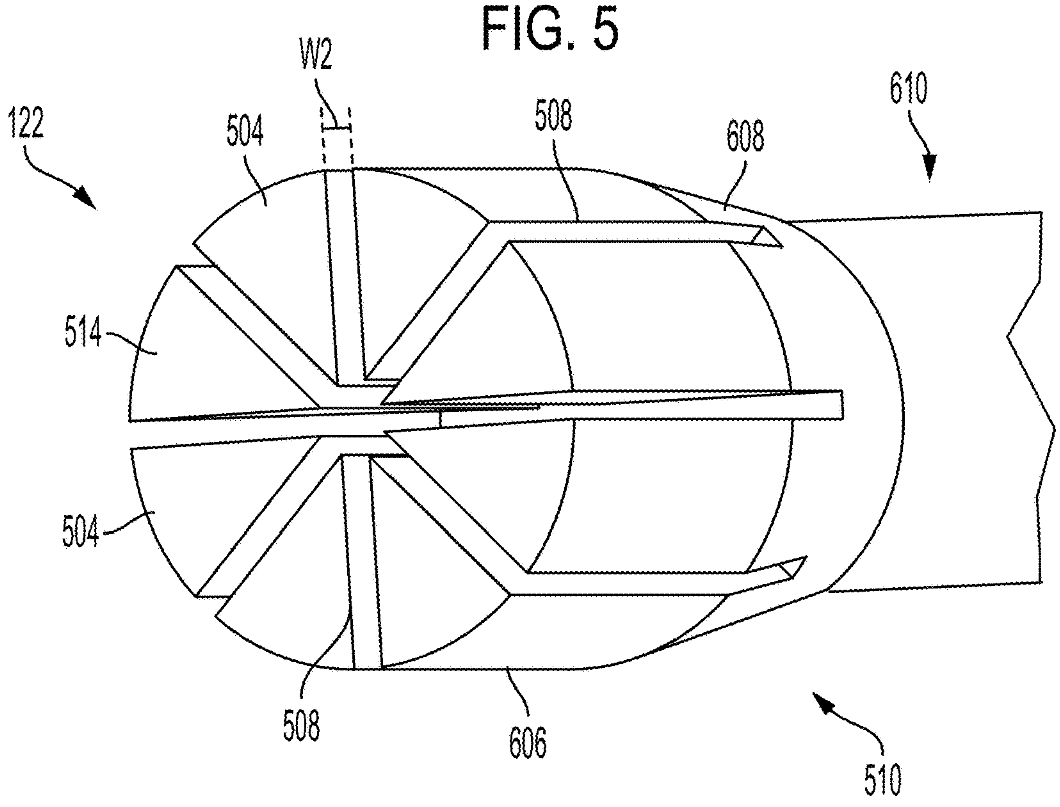
FIG. 6 depicts an isometric view of an upper portion of an RF rod in accordance with at least some embodiments of the present disclosure.

FIG. 6 depicts an isometric view of an upper portion 510 of an RF rod 122 in accordance with at least some embodiments of the present disclosure. In some embodiments, as depicted in FIG. 6, the one or more slots 508 consist of 4 slots that intersect at the center 502 of the upper end 504 to separate the upper end 504 into eight portions. As such, the RF rod 122 of FIG. 6 has an RF transmission path that is greater than the RF transmission path of the RF rod 122 depicted in FIG. 5.

In some embodiments, the RF rod 122 includes a lower portion 610 extending from the upper portion 510. The inventors have observed that an impedance of the RF rod 122 may be reduced by increasing a cross-sectional area of the upper portion 510 of the RF rod 122. Thus, in some embodiments, a cross-sectional width, or diameter in the case of a round shaped RF rod, of the upper portion 510 is greater than a width, or diameter in the case of a round shaped RF rod, of the lower portion 610. The one or more slots 508 are generally disposed in the upper portion 510. In some embodiments, the upper portion 510 includes a tapered portion 608 disposed between a top portion 606 of the upper portion 510 and the lower portion 610. The tapered portion 608 decreases in width, or diameter, from the top portion 606 to the lower portion 610.

Figure 7:
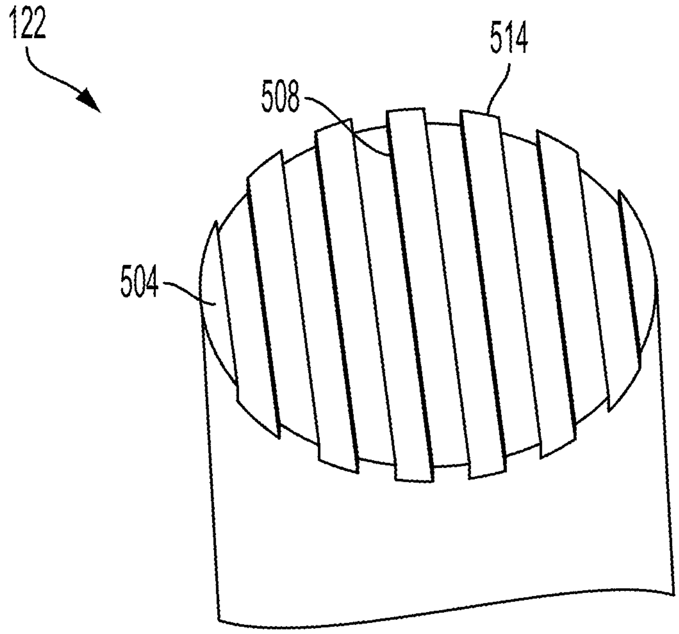
FIG. 7 depicts an isometric view of an upper portion of an RF rod in accordance with at least some embodiments of the present disclosure.
Figure 8:
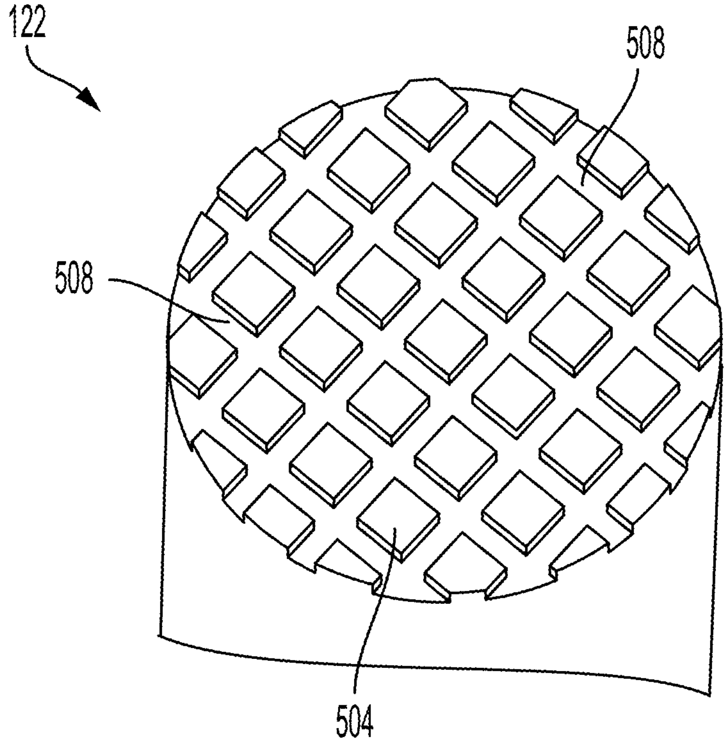
FIG. 8 depicts an isometric view of an upper portion of an RF rod in accordance with at least some embodiments of the present disclosure.

The one or more slots 508 may be arranged in any suitable pattern to increase the RF transmission path of the RF rod 122. For example, FIG. 7 depicts an isometric view of an upper portion 510 of an RF rod 122 in accordance with at least some embodiments of the present disclosure. In some embodiments, the one or more slots 508 comprise a plurality of slots arranged in a plurality of parallel rows. FIG. 8 depicts an isometric view of an upper portion 510 of an RF rod 122 in accordance with at least some embodiments of the present disclosure. In some embodiments, the one or more slots 508 are arranged in a rectilinear grid. In some embodiments, the one or more slots 508 may be arranged in one or more curved or annular patterns.

While the foregoing is directed to embodiments of the present disclosure, other and further embodiments of the disclosure may be devised without departing from the basic scope thereof.

The invention claimed is:

1. A substrate support for a process chamber, comprising:
- a pedestal having a support surface for supporting a substrate, one or more heating elements disposed therein, and an RF electrode disposed therein;
- a hollow shaft coupled to a lower surface of the pedestal; and
- an RF rod extending through the hollow shaft and having an upper portion that includes an upper end coupled to the RF electrode, wherein the upper end of the RF rod has one or more slots.

2. The substrate support of claim 1, wherein the RF rod is coupled to an impedance adjustment device having at least one of a variable inductor or a variable resistor.

3. The substrate support of claim 1, wherein the one or more slots comprise a plurality of slots extending from a center of the upper end to an outer edge of the upper end.

4. The substrate support of claim 1, wherein at least one of:
- the one or more slots are arranged in a plurality of parallel rows, or
- the one or more slots are arranged in a rectilinear grid.

5. The substrate support of claim 1, wherein the one or more slots have a depth greater than a width of the upper end.

6. The substrate support of claim 1, wherein the upper end of the RF rod has a cross sectional width that is wider than a lower portion of the RF rod.

7. The substrate support of claim 6, wherein the upper portion of the RF rod includes a tapered portion disposed between the upper end and the lower portion.

8. The substrate support of claim 1, wherein at least one of:
- the RF rod is brazed to the RF electrode with copper, gold, silver, or nickel, or
- the RF rod is plated with nickel, gold, or silver.

9. A substrate support for a process chamber, comprising:
- a pedestal having a support surface for supporting a substrate, one or more heating elements disposed therein, and an RF electrode disposed therein;
- a hollow shaft coupled to a lower surface of the pedestal; and
- an RF rod extending through the hollow shaft and having an upper end coupled to the RF electrode, wherein an RF transmission path of the RF rod comprising a total length of all edges disposed along the upper end is greater than a total length of a perimeter of the upper end of the RF rod; and wherein the upper end of the RF rod has one or more slots, wherein the one or more slots have a width of about 0.01 inches or more.

10. The substrate support of claim 9, further comprising an impedance adjustment device disposed in the hollow shaft, and wherein the impedance adjustment device includes at least one of a variable inductor or a variable resistor.

11. The substrate support of claim 9, wherein a lower end of the RF rod is coupled to a ceramic insulator.

12. A process chamber, comprising:

a chamber body defining an interior volume therein; and a substrate support disposed in the interior volume and including a pedestal having:

a support surface for supporting a substrate, one or more heating elements disposed therein, and an RF electrode disposed therein;

a hollow shaft coupled to a lower surface of the pedestal; and an RF rod extending through the hollow shaft and having an upper portion that includes an upper end coupled to the RF electrode, wherein the upper end of the RF rod has one or more slots.

13. The process chamber of claim 12, wherein the RF rod is coupled to an impedance adjustment disposed in the interior volume.

14. The process chamber of claim 12, wherein an RF transmission path of the RF rod is greater than a total length of a perimeter of the upper end of the RF rod, wherein the RF transmission path comprises a total length of all edges disposed along the upper end.

15. The process chamber of claim 12, wherein the RF electrode comprises a mesh.

16. The process chamber of claim 12, further comprising:

a heating power source coupled to the one or more heating elements; and one or more RF filters disposed between the heating power source and the one or more heating elements.

17. The process chamber of claim 12, further comprising a spacer plate disposed in the hollow shaft at a lower end of the RF rod.

18. The process chamber of claim 12, wherein the RF rod is disposed radially outward of a center of the pedestal.

* * * * *